US008058125B1

(12) United States Patent
Lin et al.

(10) Patent No.: US 8,058,125 B1
(45) Date of Patent: Nov. 15, 2011

(54) POLY RESISTOR ON A SEMICONDUCTOR DEVICE

(75) Inventors: Yu-Hsien Lin, Hsinchu (TW); Inez Fu, Hsinchu (TW); Yimin Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/850,390

(22) Filed: Aug. 4, 2010

(51) Int. Cl.
*H01L 21/8244* (2006.01)
(52) U.S. Cl. ......... 438/238; 438/171; 438/183; 438/382
(58) Field of Classification Search .................. 438/171, 438/183, 238, 382
See application file for complete search history.

(56) References Cited

U.S. PATENT DOCUMENTS

| 5,108,945 | A  | * | 4/1992  | Matthews ..................... | 438/384 |
| 6,406,956 | B1 |   | 6/2002  | Tsai et al. |  |
| 6,531,758 | B2 | * | 3/2003  | Shin et al. ..................... | 257/536 |
| 2006/0234439 | A1 | * | 10/2006 | Howard et al. ............... | 438/238 |
| 2010/0001369 | A1 | * | 1/2010  | Chuang et al. ................ | 257/526 |
| 2010/0328022 | A1 | * | 12/2010 | Fan et al. ...................... | 338/309 |

OTHER PUBLICATIONS

Da-Yuan Lee and Matt Yeh; "A Precise Resistor on a Semiconductor Device;" U.S. Appl. No. 12/770,166, filed Apr. 29, 2010; 34 Pages.

* cited by examiner

*Primary Examiner* — Alexander Ghyka
(74) *Attorney, Agent, or Firm* — Haynes and Boone, LLP

(57) ABSTRACT

The present disclosure provides a poly resistor on a semiconductor device and a method of fabricating the same. In an embodiment, a poly silicon resistor device is formed by providing a substrate having a first region and a second region. A dummy gate stack is formed on the substrate in the first region, wherein the dummy gate stack has a dummy gate stack thickness extending above the substrate. A poly silicon resister is formed on the substrate in the second region, wherein the poly silicon resistor has a poly silicon resistor thickness extending above the substrate a distance which is less than the dummy gate stack thickness. A dopant is implanted into the substrate in the first region thereby forming a source region and a drain region in the first region of the substrate. The dopant is also implanted into the poly silicon resistor. An inter-level dielectric (ILD) layer is formed on the substrate over the dummy gate stack and also over the poly silicon resistor. The ILD layer is planarized, thereby exposing the dummy gate stack and leaving a portion of the ILD layer over the poly silicon resistor. The dummy gate stack is replaced with a high k metal gate while using the portion of the ILD layer over the poly silicon resistor as a mask to protect the poly silicon resistor during replacement of the dummy gate stack with the high k metal gate.

14 Claims, 8 Drawing Sheets

US 8,058,125 B1

POLY RESISTOR ON A SEMICONDUCTOR DEVICE

BACKGROUND

Polysilicon resistors have been frequently used in conventional integrated circuit (IC) design. Likewise, due to shrinking technology nodes, high-k dielectric material and metal are often considered to form a gate stack for a semiconductor device such as a metal-oxide-semiconductor field-effect transistor (MOSFET). However, various integration issues exist when combining polysilicon resistors and metal-gate MOSFETs onto a single IC chip. One solution is to utilize a dummy gate when forming a polysilicon resistor. A gate replacement process, such as an etch process, can then be implemented to remove the dummy gate. However, the formed polysilicon resistors can be damaged and recessed by the etch process, causing the deviation of the resistance of the polysilicon resistor from the designed target and other problems. A solution to this problem is to deposit the polysilicon resistor at the same time of depositing the dummy gate and covering the polysilicon resistor with a hard mask during implantation of the of the source/drain regions and/or during formation of the dummy gate replacement. However, this causes a need for an extra hard mask deposition, which in-turn adds complexity and cost to the fabrication process. Therefore, an improved polysilicon resistor structure and a method making are needed to address the above issues.

SUMMARY

In an embodiment, the present disclosure provides a poly resistor on a semiconductor device and a method of fabricating the same. In an embodiment, a poly silicon resistor device is formed by providing a substrate having a first region and a second region. A dummy gate stack is formed on the substrate in the first region, wherein the dummy gate stack has a dummy gate stack thickness extending above the substrate. A poly silicon resister is formed on the substrate in the second region, wherein the poly silicon resistor has a poly silicon resistor thickness extending above the substrate a distance which is less than the dummy gate stack thickness. A dopant is implanted into the substrate in the first region thereby forming a source region and a drain region in the first region of the substrate. The dopant is also implanted into the poly silicon resistor. An inter-level dielectric (ILD) layer is formed on the substrate over the dummy gate stack and also over the poly silicon resistor. The ILD layer is planarized, thereby exposing the dummy gate stack and leaving a portion of the ILD layer over the poly silicon resistor. The dummy gate stack is replaced with a high k metal gate while using the portion of the ILD layer over the poly silicon resistor as a mask to protect the poly silicon resistor during replacement of the dummy gate stack with the high k metal gate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
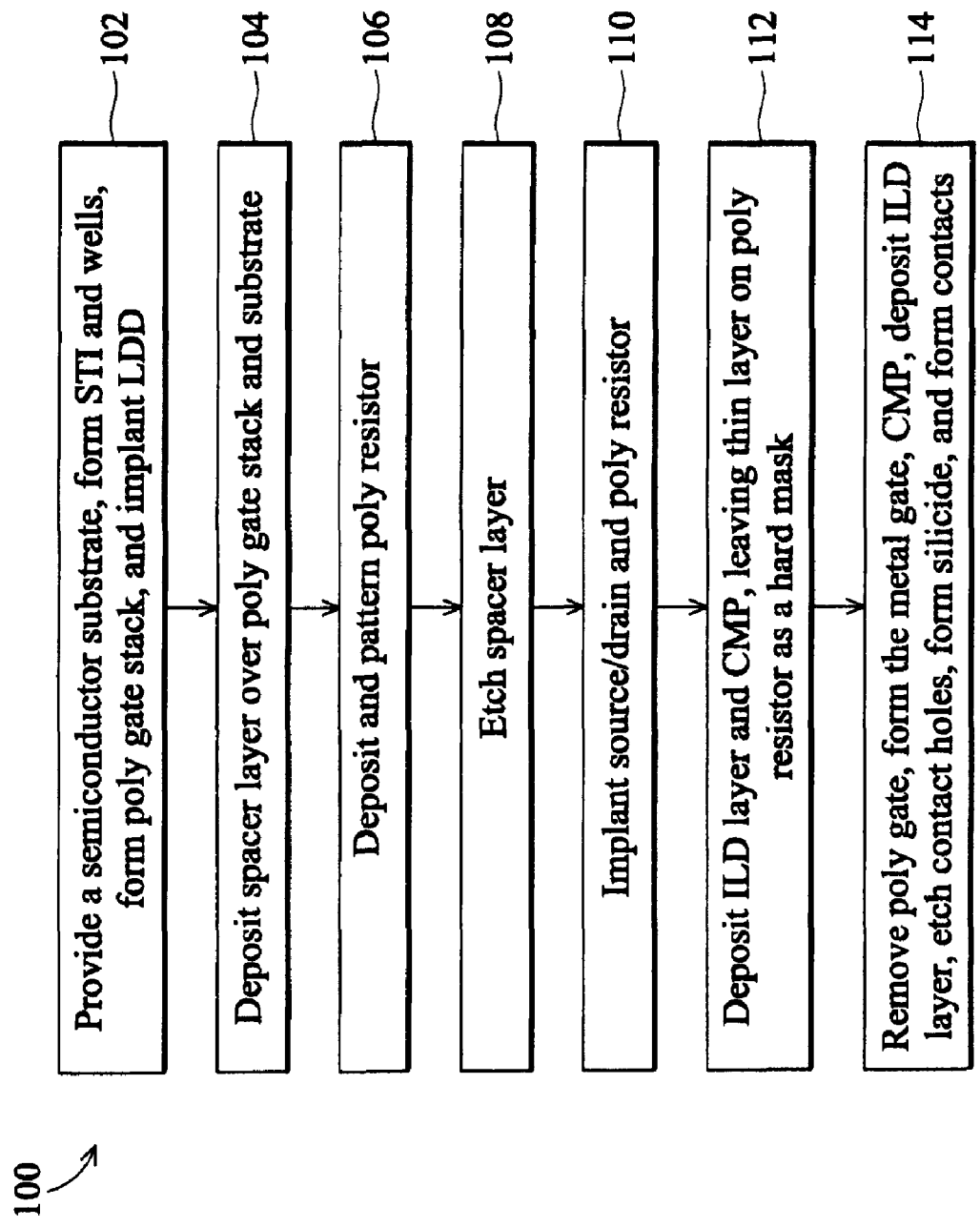
FIG. 1 is a flowchart of a method making a semiconductor device having a metal gate stack and a polysilicon resistor constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device according to one embodiment. The semiconductor device includes a metal gate stack and a polysilicon resistor constructed according to various aspects of the present disclosure. FIGS. 2 through 7 are sectional views of a semiconductor structure 200 at various stages of fabrication and constructed according to one or more embodiments. The semiconductor structure 200 and the method 100 of making the same are collectively described with reference to FIGS. 1 through 7. It is to be understood that one or more of the processes described for method 100 herein may be omitted and other processes may be added, which are not described herein.

Figure 2:
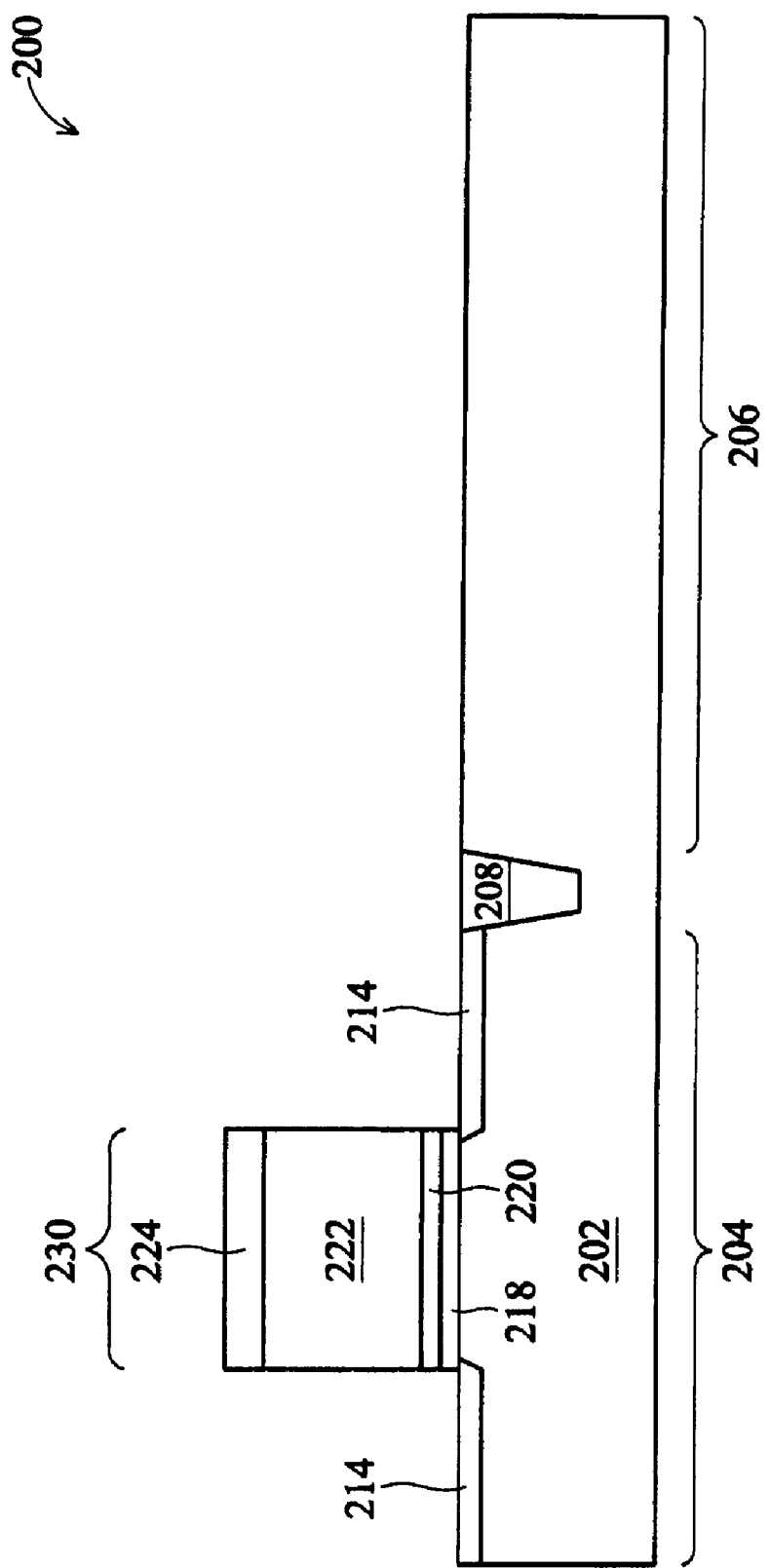
FIGS. 2-7 are sectional views of one embodiment of a semiconductor structure having a metal gate stack and a polysilicon resistor at various stages of fabrication according to various aspects of the present disclosure.

Referring to FIGS. 1 and 2, the method 100 begins at step 102 by providing a semiconductor substrate 202, forming an STI feature 208 and LDD wells 214 in the substrate 202 and forming a dummy poly gate stack 230 on the substrate 202. The semiconductor substrate 202 includes silicon. Alternatively, the substrate includes germanium, silicon germanium or other proper semiconductor materials. As described in more detail below, the semiconductor substrate 202 may include various doped regions, such as n-well and p-well gate/source features. In an embodiment, the semiconductor substrate 202 includes a first region (e.g., resistor region) 206 on which one or more passive devices, such as polysilicon resistors are formed and a second region (e.g., device region) 204 on which one or more active devices, such as field-effect transistors (FETs) are formed.

The semiconductor substrate 202 also includes an isolation feature such as a shallow trench isolation (STI) feature 208 formed in the substrate 202 to separate various features of the device 200. In an embodiment, the STI feature 208 is formed in the substrate 202. The formation of the STI features 208 includes etching a trench in the substrate 202 and filling the trench with one or more insulator materials such as silicon oxide, silicon nitride, or silicon oxynitride. The filled trench may have a multi-layer structure such as a thermal oxide liner layer with silicon nitride filling the trench. In one embodiment, the STI feature 208 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure 208.

The substrate 202 includes lightly doped drain (LDD) regions 214 formed by one or more implantation processes (not shown). When the device region 204 includes both n-type FETs (nFETs) and p-type FETs (pFETs), the source and drain regions are formed, respectively, for the n-type FETs and the p-type FETs, using proper doping species. In one embodiment, taking n-type FETs as an example, the LDD features 214 are formed by an ion implantation with a light doping dose. The various features of the p-type FETs can be formed in a similar procedure but with opposite doping type. In one embodiment of the procedure to form various source and drain features for both nFETs and pFETs, the LDD features 214 of nFETs are formed by an ion implantation while the regions of pFETs and the resistors are covered by a patterned photoresist layer; the LDD features 214 of pFETs are formed by an ion implantation while the regions of nFETs and the resistors are covered by another patterned photoresist layer. A high temperature annealing process may follow implantation to activate the various doping species in the LDD features 214.

The method 100 also forms the dummy poly gate stack 230 on the substrate 202. In one embodiment, the gate material layers include multi-layer dielectric materials, such as an interfacial layer 218 (e.g., silicon oxide) and a high k dielectric material layer 220 disposed on the interfacial layer. The gate stack material layers also include a polycrystalline silicon (polysilicon) layer 222. In the present embodiment, the silicon layer 222 is non-doped and the dielectric material layer 220 includes a high-k dielectric material layer. The silicon layer 222 alternatively or additionally may include amorphous silicon. The high-k dielectric layer 220 includes a dielectric material having the dielectric constant higher than that of thermal silicon oxide, which is about 3.9. In one example, the high-k dielectric layer 220 includes hafnium oxide (HfO). In various examples, the high-k dielectric layer 220 includes metal oxide, metal nitride, or combinations thereof. In one example, the high-k dielectric layer 220 includes a thickness ranging between about 10 angstrom and about 100 angstrom. A hard mask layer 224, such as silicon nitride (SiN) or silicon oxide (SiO2), is formed on the gate material layers 230 for gate patterning.

In various embodiments, the interfacial layer 218 may be formed by chemical oxide technique, thermal oxide procedure, atomic layer deposition (ALD) or chemical vapor deposition (CVD). The high k dielectric material layer 220 may be formed by CVD, ALD, plasma enhanced CVD (PE CVD), or plasma enhanced ALD (PEALD). The non-doped amorphous silicon or polysilicon layer 222 can be formed using CVD with precursor silane (SiH4) or other silicon based precursor. The deposition of the non-doped amorphous silicon layer 222 can be performed at a raised temperature. In one example, the deposition temperature is greater than about 400° C. In another example, the deposition temperature is greater than about 530° C. The hard mask layer (SiN or SiO2) can be formed by CVD or other suitable technique.

The patterning of the gate material layers of the gate stack 230 can be achieved by a lithography process and/or an etch process. For example, a patterned photoresist layer is formed on the hard mask layer 224 defining various resistor regions and gate regions, using a photolithography process including photoresist coating, soft baking, exposing, post-exposure baking (PEB), developing, and hard baking. Then, the hard mask layer 224 is etched through the openings of the patterned photoresist layer, forming a patterned hard mask. The gate material layers are further etched using the patterned hard mask, forming the gate stack. The patterned photoresist layer is removed thereafter using a suitable process, such as wet stripping or plasma ashing. Alternatively, if the hard mask layer is not present, then the patterned photoresist layer is directly utilized as an etch mask to etch the gate material layers.

Figure 3:
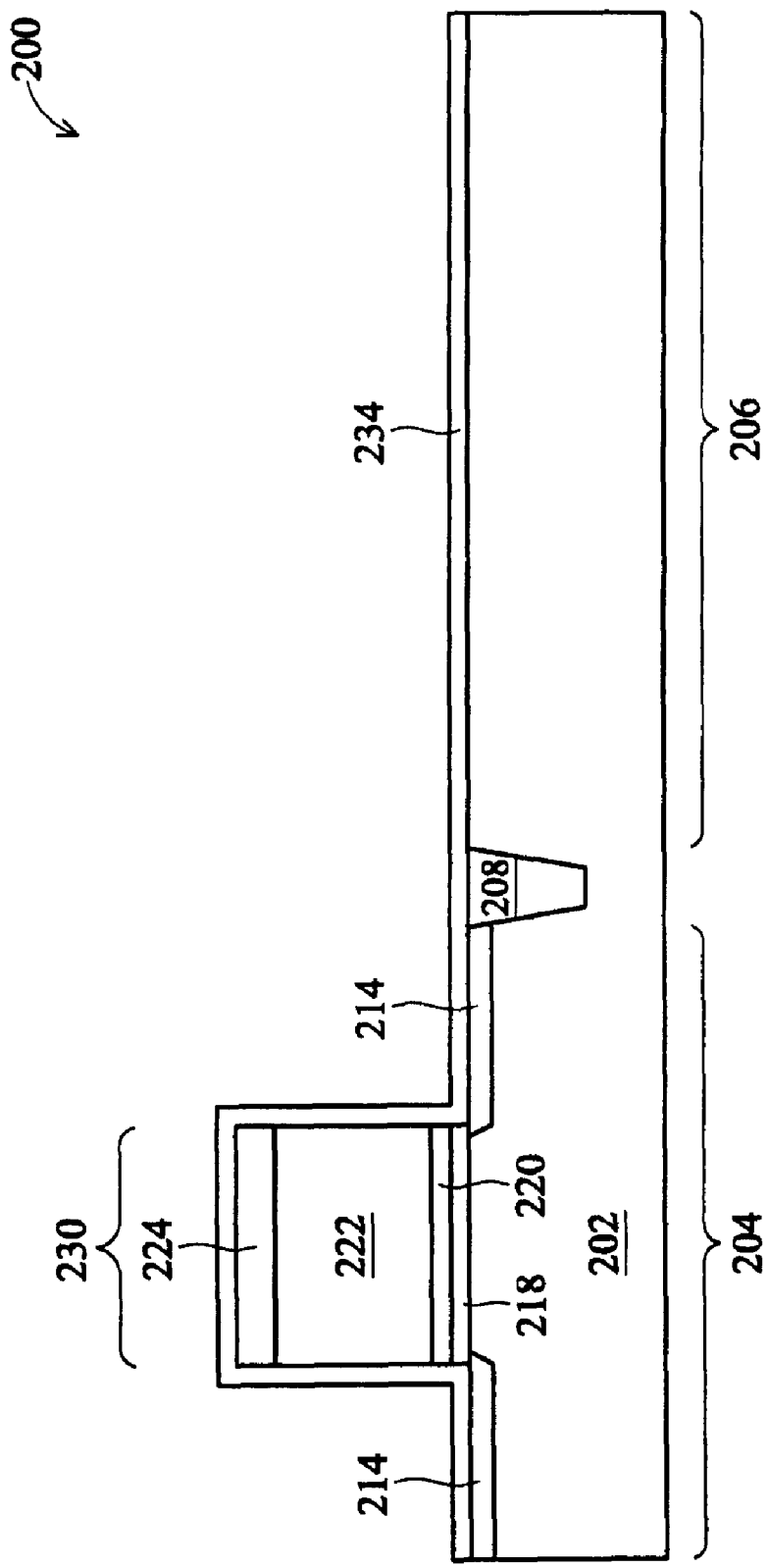

Referring to FIGS. 1 and 3, the method 100 proceeds to step 104 by depositing a spacer layer 234 over the poly gate stack 230 and the substrate 202 in both the device region 204 and the resistor region 206. In an embodiment, the spacer layer 234 is formed by dielectric deposition of silicon nitride (SiN) to a thickness range of approximately 50-100 angstrom. The spacer layer 234 provides an insulative layer on the substrate 202.

Figure 4:
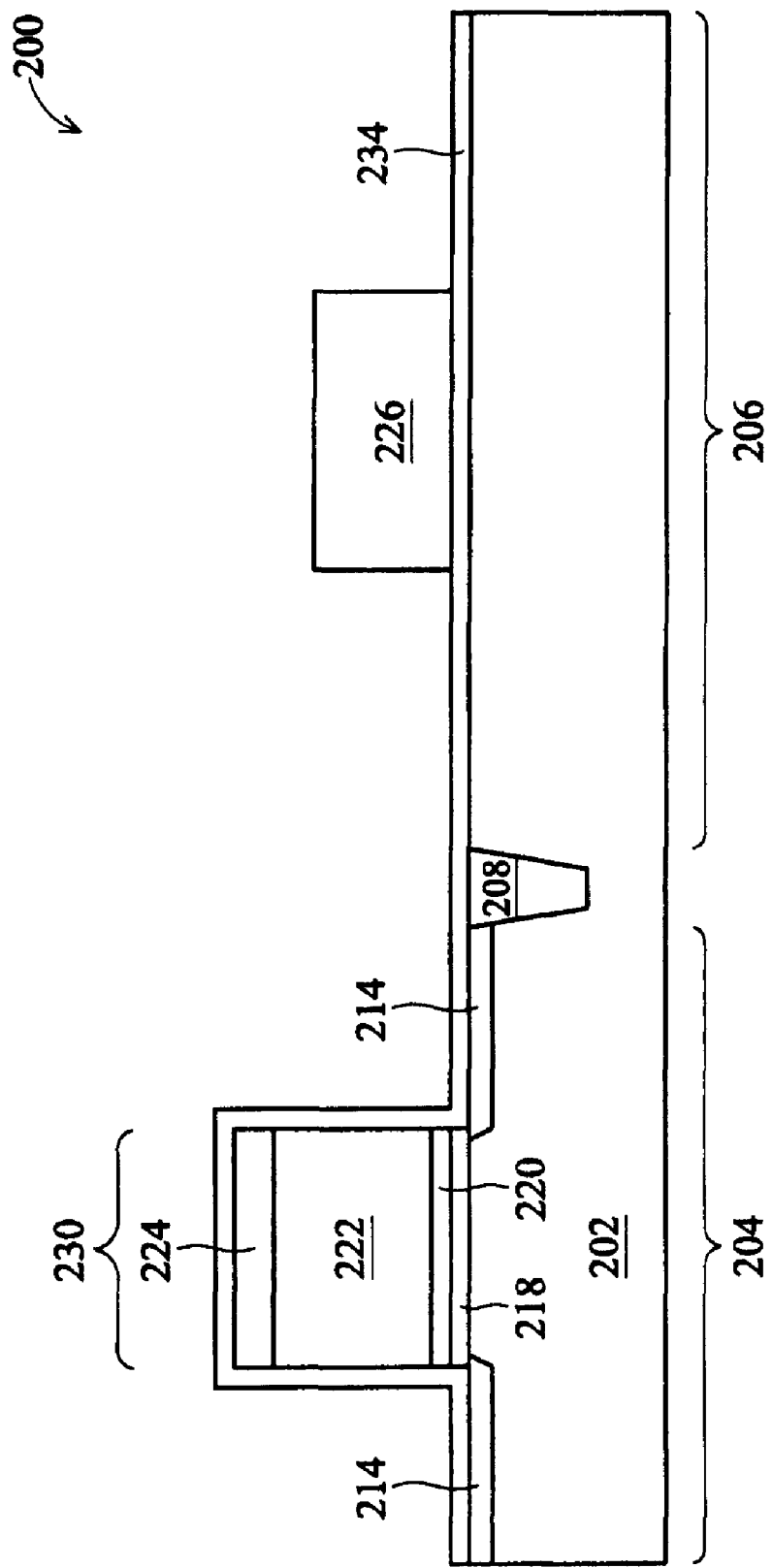

Referring to FIGS. 1 and 4, the method 100 proceeds to step 106 by depositing and patterning a polysilicon layer to form a poly resistors 226. The patterning of the poly resistor material layer can be achieved by a lithography process and/or an etch process. For example, a patterned photoresist layer is formed on the poly silicon resistor layer defining the resistor region 226, using a photolithography process including photoresist coating, soft baking, exposing, post-exposure baking (PEB), developing, and hard baking. Then, the poly silicon layer is etched through the openings of the patterned photoresist layer, forming the various resistor 226. The patterned photoresist layer is removed thereafter using a suitable process, such as wet stripping or plasma ashing. In an embodiment, the resistor 226 is formed in the resistor/passive region 206 to form a passive device. This passive device can be used for a resistor or alternatively used as a polysilicon fuse. In an embodiment, the gate stack 230 is formed in the device region 204 for a field-effect transistor (FET), such as a metal-oxide-semiconductor (MOS) transistor. The FET can be an n-type field-effect transistor (nFET) or a p-type field-effect transistor (pFET). The poly resistor 226 may be doped with a pMOS source/drain device to form a p+ poly resistor or doped with an nMOS source/drain device to form a n+ poly resistor.

In an embodiment, the height of the poly resistor (e.g., spacer layer 234 and poly silicon layer 226) is shorter than the height of the poly gate stack 230 (e.g., the interfacial layer 218, the high-k dielectric layer 220 and the poly silicon layer 222). For example, in an embodiment, the gate stack layers (224 and 218 and/or 220) have a height of approximately 400 angstrom, and has a height range of approximately 400-800 angstrom. Accordingly, in this embodiment, the spacer layer 234 and poly resistor 226 height is approximately 50 angstrom lower, and is in a range of approximately 40-100 angstrom lower than the upper surface (as viewed in FIG. 5), of the poly gate 222. Because the poly resistor 226 layer is deposited separately from the dummy poly gate layer 222, the thickness of the poly resistor 226 layer may be formed at any thickness to obtain proper electrical resistivity.

Figure 5:
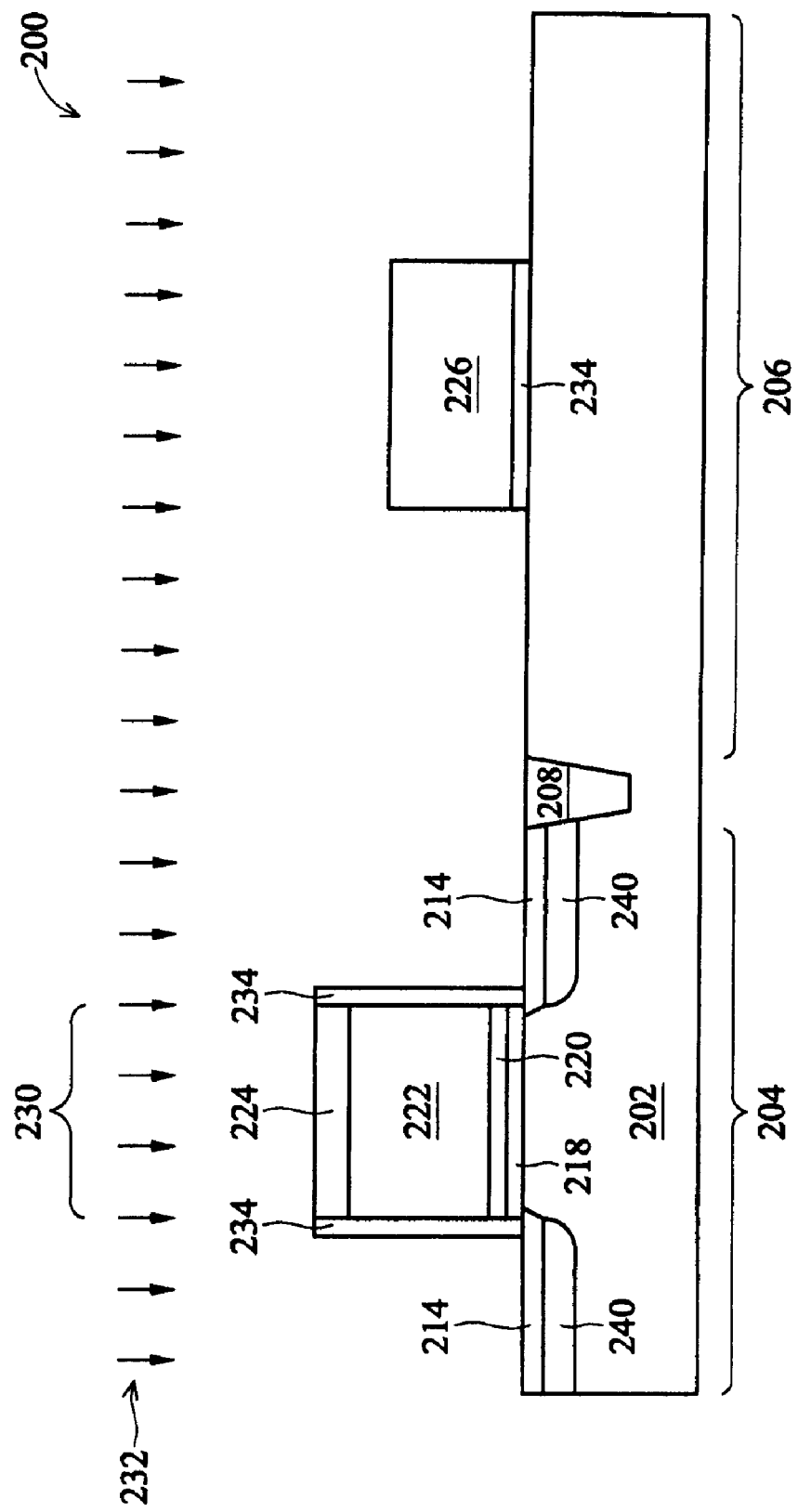

Referring to FIGS. 1 and 5, the method 100 proceeds to step 108 by etching the spacer layer 234. The spacer layer 234 is etched using anisotropic etch, such as plasma etch process to remove the spacer layer except below the poly resistor 226 (which acts as mask for the spacer layer 234 during the etch process) and adjacent the gate stack 230. A patterned photoresist layer may be used to pattern the spacers 234 along the sides of the gate stack 230.

Still referring to FIGS. 1 and 5, the method 100 proceeds to step 110 by performing an ion implantation process 232 to introduce a doping species into the resistor 226 to adjust the electrical resistance of the resistor 226 and to form source/drain regions 240 in the substrate 202. The implantation process 232 may be performed in one or more implanting steps. A patterned photoresist layer may be formed on the substrate 202 to cover one or more region on the substrate 202 while the un-masked regions are exposed through the openings of the patterned photoresist layer. The ion implantation process 232 is applied to the resistor region 206 such that doping species are introduced into the resistor 226 and effectively change the resistance thereof. The step 110 can be implemented in other alternative procedures to introduce the doping species. In an embodiment, the hard mask layer 224 protects the poly gate layer 222 from the implantation process 232. A diffusion process may be implemented to introduce the doping species to the resistor 226.

The ion implantation process 232 (or diffusion) uses a p-type doping species, such as boron (B), to be introduced into the resistor 226. Alternatively, other boron-containing doping species, such as boron-difluoride (BF2), is utilized. In the ion implantation process 232, the doping energy is adjusted according to the thickness of the resistors such that the doping species may be uniformly distributed in the resistor 226 from the top to the bottom. Alternatively, the doping energy is adjusted such that the doping species are distributed into a portion of the resistor 226. After subsequent annealing process, the doping species can be uniformly distributed in the resistor 226. The doping dose is tuned according to the thickness of the resistor 226 and the designed resistivity or resistance of the resistor 226 such that the final resistivity or resistance of the resistor 226 is within the designed region. In one embodiment, the doping concentration of the resistors is below about $5 \times 10^{18}/cm^3$. When the thickness of the resistors is about or less than 1 micron, then the doping dose is less than about $1 \times 10^{14}/cm^2$.

A previously mentioned, the implantation process 232 also forms source and drain regions 240 in the device region 204. In one embodiment, the source and drain regions 240 include the lightly doped drain (LDD) regions 214 and heavily doped source and drain (S/D) features 240 formed by one or more implantation processes 232. When the device region 204 includes both n-type FETs (nFETs) and p-type FETs (pFETs), the source and drain regions 240 are formed, respectively, for the n-type FETs and the p-type FETs, using proper doping species. The spacers 234 define the S/D features 240 by blocking a portion of the implantation process 232 from reaching the substrate 202. The heavily doped S/D features 240 are formed by an ion implantation with a heavy doping dose. The various source and drain features of the p-type FETs can be formed in a similar procedure but with opposite doping type than that used for n-type FETs. During various doping processes to form various source and drain features and/or the resistor region 206 may be protected by a patterned photoresist layer. In one embodiment, a high temperature annealing process is followed to activate the various doping species in the source and drain regions 240 and the resistor 226.

Figure 6:
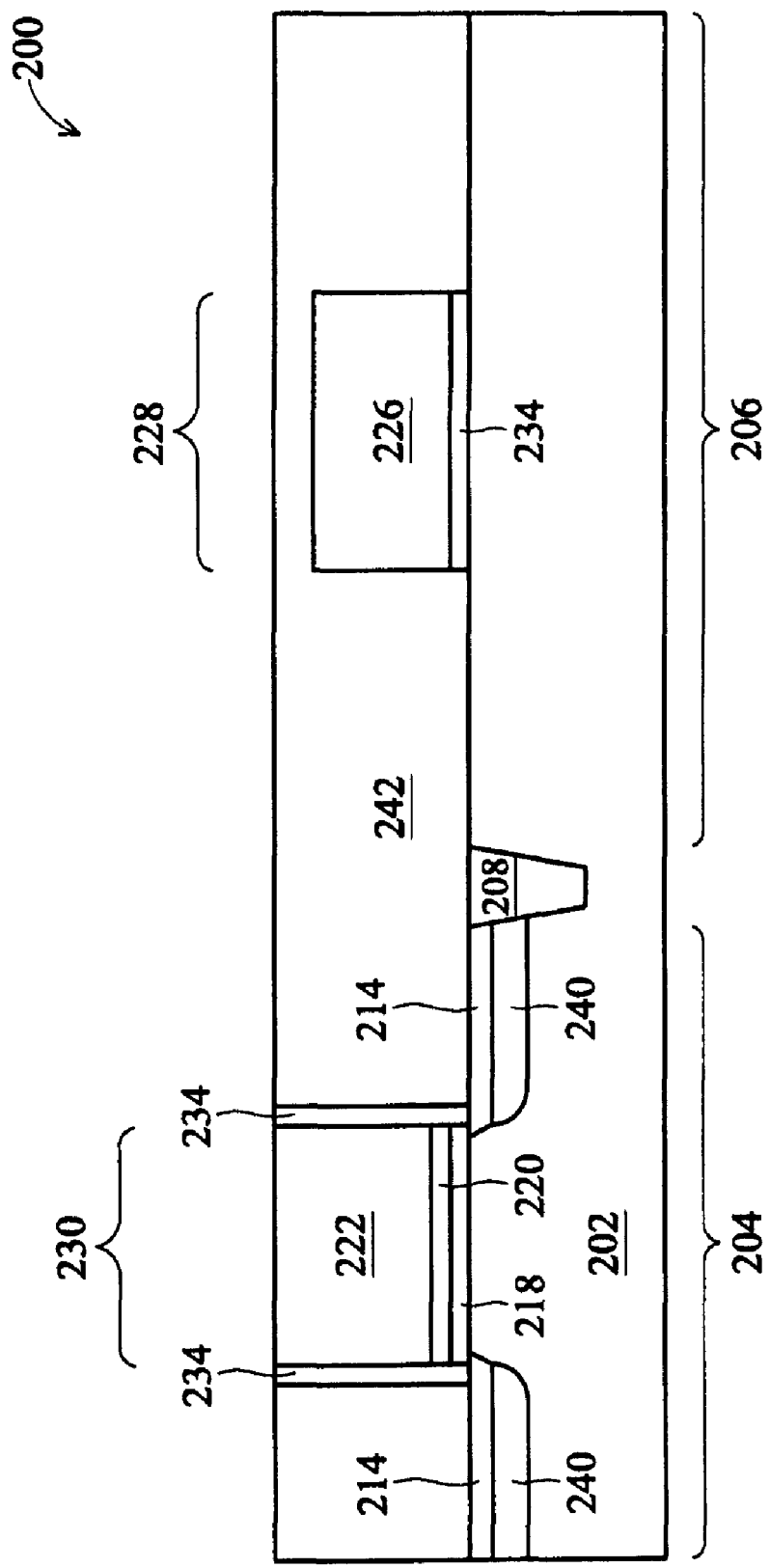

Referring to FIGS. 1 and 6, the method 100 proceeds to step 112 by forming an inter-level dielectric (ILD) layer 242 on the semiconductor substrate 202. The ILD layer 242 includes silicon oxide, low k dielectric material, other suitable dielectric materials, or combinations thereof. The ILD layer 242 is formed by a suitable technique, such as CVD. For example, a high density plasma CVD can be implemented to form the ILD layer 242. In one embodiment, the ILD layer 242 deposits on the substrate 202, and fills in the gaps between the gate stack 230 and the resistor 226. In an embodiment, the ILD layer 242 is formed on the substrate to a level above the top surface of the gate stack 222 and the resistor 226.

A chemical mechanical polishing (CMP) process is applied to the ILD layer 242 to reduce the thickness of the ILD layer 242 such that the hard mask 224 is removed and the gate stack layers 230 are exposed from the top side. Because the resistor 226 has a thickness that is less than the thickness of the gate stack 230, there is a portion of the ILD layer 228 remaining over the resistor 226 to protect the resistor 226 from processing for the high-k metal gate replacement process described below. The processing conditions and parameters of the CMP process, including slurry chemical and polishing pressure, can be tuned to partially remove and planarize the ILD layer 242.

Figure 7:
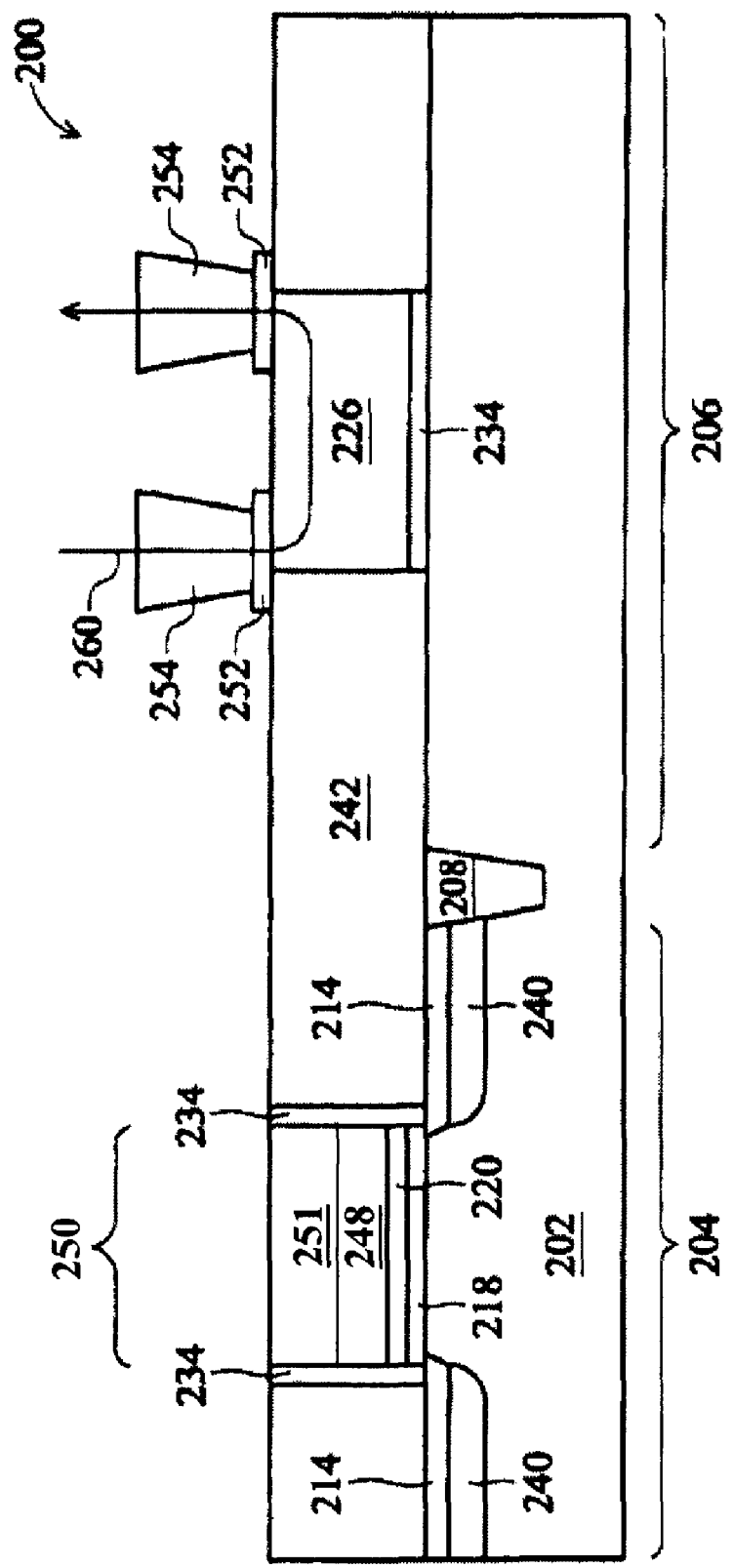

Referring to FIGS. 1, and 7, the method 100 proceeds to step 114 by forming a metal gate 250 in the device region 204. First, an etch process is applied to remove the polysilicon or amorphous silicon of the dummy gate 222 within the device region 204. In an embodiment, the etch process removes any remaining portion of the hard mask layer 224 as well. The remaining ILD layer 228 over the resistor 226 effectively protects the resistor 226 from removal by the etch process. Alternatively, the etch process includes two steps wherein the first step is designed to remove the hard mask layer 224 and the second step is designed to remove the silicon in the dummy gates of the device region 204 while the resistors are protected by the ILD 228. After the silicon in the dummy gates 222 of the device region 204 is removed, trenches are formed in the region of the dummy gates and are referred to as gate trenches. In one embodiment, the etching process used to remove the polysilicon or amorphous silicon of the gate stacks in the device region 204 may implement suitable dry etching, wet etching or combinations thereof. In one example, an etching solution including HNO3, H2O and HF, or NH4OH solution, may be used to remove polysilicon (or amorphous silicon). In another example, chlorine (Cl)-based plasma may be used to selectively remove the polysilicon.

Then, one or more metal gate material layers are formed in the gate trenches. In one embodiment, a metal layer 248 having proper work function (referred to as a work function metal) and a conductive layer 251 is filled in the gate trench. In one embodiment, the gate trench is deposited with a work function metal (not shown) and then is filled with the conductive material 251, forming a gate electrode for a pFET. The work function metal for the pFET is referred to as a p-metal. The p-metal includes a metal-based conductive material having a work function compatible to the pFET. For one example, the p-metal has a work function of about or greater than about 5.2 eV. In one embodiment, the p-metal includes titanium nitride (TiN) or tantalum nitride (TaN). In other embodiments, the p-metal include TiN, tungsten nitride (WN), tantalum nitride (TaN), or combinations thereof. The p-metal may include various metal-based film as a stack for optimized device performance and processing compatibility. The p-metal layer can be formed by a suitable process, such as physical vapor deposition (PVD), CVD, ALD, PECVD, PEALD or spin-on metal. The conductive material 251 thereafter substantially fills in the gate trench, as illustrated in FIG. 7. The conductive material 251 includes aluminum or tungsten according to various embodiments. The method to form the conductive material may include PVD, CVD, ALD, PECVD, PEALD or spin-on metal. Then, as shown in FIG. 7, a CMP process may be applied to remove the ILD layer 242 that was above the resistor 226 (shown in FIG. 6) and any excessive work function metal or conductive material that may have been formed when forming the metal gate 250, and thus planarize the device 200.

Alternatively, the gate trench is deposited with a work function metal of a n-metal and then is filled with the conductive material 251, forming a gate electrode for a nFET. The n-metal includes a metal-based conductive material having a work function compatible to the nFET. For one example, the n-metal has a work function of about or less than about 4.2 eV. In one embodiment, the n-metal includes tantalum (Ta). In another embodiment, the n-metal include titanium aluminum (TiAl), titanium aluminum nitride (TiAlN), or a combination thereof. In other embodiments, the n-metal include Ta, TiAl, TiAlN, or combinations thereof. The n-metal may include various metal-based film as a stack for optimized device performance and processing compatibility. The n-metal layer can be formed by a suitable process, such as PVD. Then, a CMP process may be applied to remove the excessive work function metal and the conductive material. In one embodiment, the device region 204 includes both nFETs and pFETs (not shown). In this case, the metal gates are formed for the nFETs and pFETs, respectively by a proper procedure. For example, after the removal of the silicon from the dummy gates in the device region, the metal gates for the pFETs are formed by a deposition for the p-metal layer, a deposition for the conductive layer and a CMP process to remove the excessive p-metal layer and the conductive layer while the nFETS are protected by a patterned photoresist layer. Then the metal gates for nFETs are formed by a deposition for the n-metal layer, a deposition for the conductive layer, and a CMP process to remove the excessive n-metal layer and the conductive layer. Alternatively, a p-metal layer is deposited for the pFETs while the nFETs are protected by a patterned photoresist layer. A n-metal layer is deposited for the nFETs while the pFETs are protected by another patterned photoresist layer. Then a conductive layer is deposited to fill gate trenches for both nFETs and pFETs. A CMP process is applied to the substrate to remove the excessive portion of the n-metal layer, p-metal layer, and conductive layer, forming the metal gates for both nFETs and pFETs.

Figure 8:
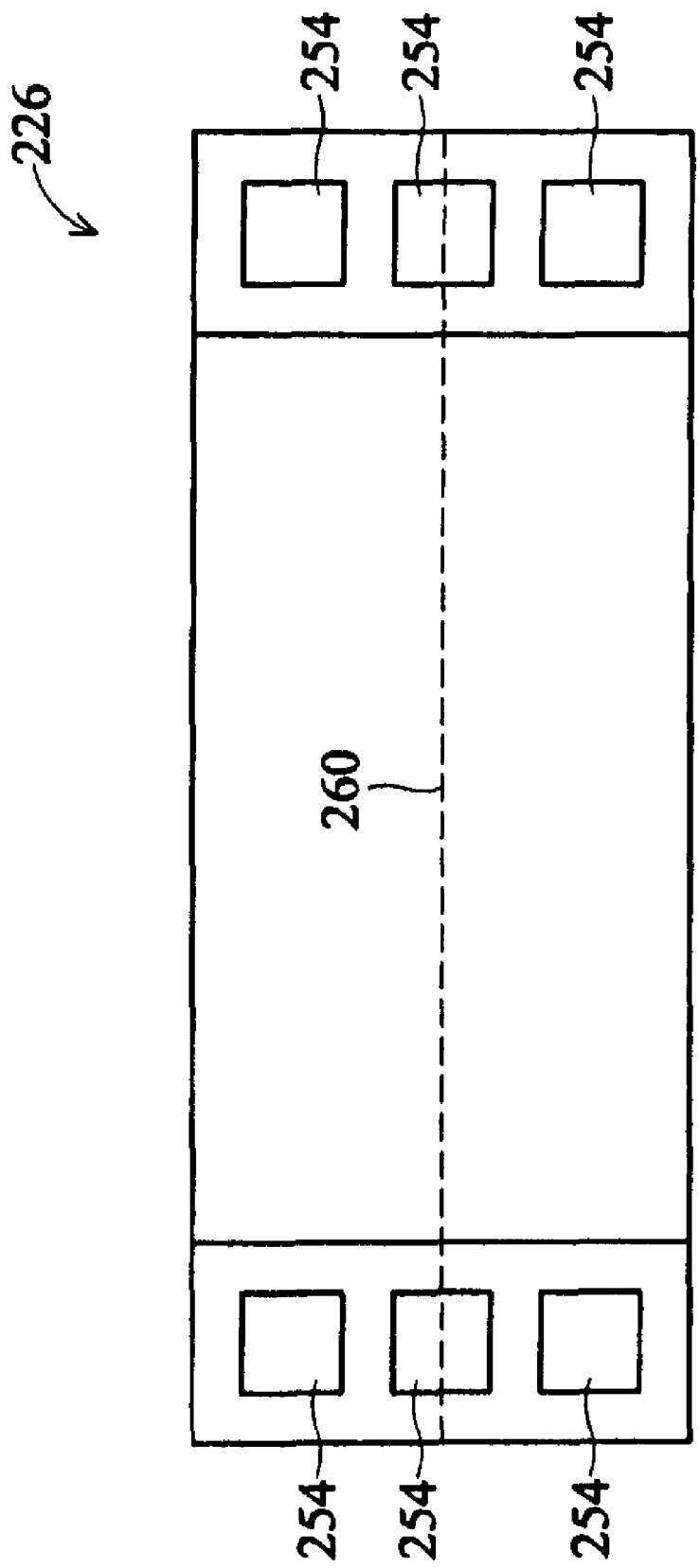
FIG. 8 illustrates how electrical current may flow through a multi-contact poly resistor device.

Other processing steps may be implemented before, during and/or after the formation of the resistor 226, and any active devices, such as nFETs, and/or pFETs. For example, contact holes may be etched in the device 200 where an interconnection layer, such as a silicide 252, may be formed using a damascene or other process. The interconnection may include vertical interconnects, such as conventional vias or contacts (e.g., 254), and horizontal interconnects, such as metal lines. The contacts 254 allow electrical current to flow through the poly resistor 226, such as that shown with arrow 260. The various interconnection features may implement various conductive materials including copper, tungsten and silicide. In one example, a damascene process is used to form copper related multilayer interconnection structure 252. In another embodiment, tungsten is used to form tungsten plug in the contact holes. FIG. 8 illustrates how electrical current may flow 260 through a multi-contact poly resistor device, such as the poly resistor 226 when configured as a multi-contact resistor.

Although not shown, other alternatives and features may be present and other processing steps may be present to form various features. In one embodiment, the one or more resistors in the resistor region 206 can be properly configured and alternatively used as a polysilicon fuse (or amorphous silicon fuse) for other applications. In another embodiment, the resistors are configured as an array, each being disposed on the shallow trench isolation (STI) 208 and adjacent passive devices being separated by active regions. The semiconductor structure 200 is a portion of an integrated circuit having both plurality of resistors and various field effect transistors each with a gate stack of high k dielectric and metal electrode. In another embodiment, the polysilicon layer 222 can be in-situ boron doped.

In another embodiment, p-metal layers and n-metal layers are formed in different orders such that n-metal layer is formed first and the p-metal layer is formed thereafter. In another embodiment, a pFET has a strained structure for enhanced carrier mobility and improved device performance. In furtherance of the embodiment, silicon germanium (SiGe) is formed in the source and drain regions of the pFET to achieve a proper stress effect. In one example of forming such a strained pFET, the silicon substrate within the source and drain regions of the pFET are recessed by one or more etching step. Then SiGe is epi grown in the recessed regions and heavy doped source and drain are formed in the epi grown SiGe features. In another example, the dummy spacer is formed after the formation of the LDD features. The dummy spacer may be removed after the formation of the SiGe features and later replaced on the sidewalls of the associated gate stack.

In another embodiment, a nFET has a strained structure for enhanced carrier mobility and improved device performance. In furtherance of the embodiment, silicon carbide (SiC) is formed in the source and drain regions of the nFET to achieve a proper stress effect at step. The strained nFET can be formed similarly as the strained pFET is formed. In another embodiment, the n-metal and p-metal layers each may include other proper metal or metal alloy. In another embodiment, the n-metal and p-metal layers each have a multi-layer structure to have an optimized work function and reduced threshold voltage.

In one example, the high k dielectric layer 220 can be formed by other suitable process such as metal organic chemical vapor deposition (MOCVD), or molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides. In another example, the interfacial layer 218, such as silicon oxide, is formed on the silicon substrate by a thermal oxidation, ALD, UV-Ozone Oxidation or other suitable method. In another example, a capping layer may be interpose between the high k dielectric layer and the n-metal (or p-metal) layer.

In an alternative embodiment, a high k dielectric material layer can be formed in the gate stack 230 of the device region 204 after the removal of the dummy polysilicon layer 222 from the gate stack 230. For example, the dielectric material layer 218 may include only a silicon oxide layer as a dummy oxide layer, then the high k metal gate (HKMG) stack is formed by a high k last procedure where both a high k dielectric material layer and metal layer(s) are formed to fill the gate trench. Thus formed HKMG stack is also referred to as complete replacement gate. In furtherance of the present embodiment of the high k last procedure, the dummy polysilicon layer 220 and the dummy oxide layer 218 are removed from the gate stack 230, forming a gate trench in the device region 204. Then both the high k dielectric material layer and the metal layer(s) are formed in the gate trench. A CMP process may be applied thereafter to remove the excessive high k dielectric material layer and the metal layer(s) and planarize the surface of the semiconductor structure 200. The high k dielectric material layer of the HKMG stack can be formed by other gate-last process (or partial replacement gate) or other high k last process.

In another example, the formation of STI 208 may include etching a trench in the substrate 202 and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure 208 may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to etch back.

The various patterning process may include forming a patterned photoresist layer by a photolithography process. An exemplary photolithography process may include processing steps of photoresist spin-on coating, soft baking, mask aligning, exposing, post-exposure baking, developing photoresist and hard baking. The photolithography exposing process may also be implemented or replaced by other proper methods such as maskless photolithography, electron-beam writing, ion-beam writing, thermal lithography, and molecular imprint.

The present disclosure is not limited to applications in which the semiconductor structure includes a FET (e.g. MOS transistor) and a polysilicon resistor (or polysilicon fuse), and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a poly silicon resistor device, the method comprising:
    providing a substrate having a first region and a second region;
    forming a dummy gate stack on the substrate in the first region, wherein the dummy gate stack has a dummy gate stack thickness extending above the substrate;
    forming a poly silicon resistor on the substrate in the second region, wherein the poly silicon resistor has a poly silicon resistor thickness extending above the substrate less than the dummy gate stack thickness;
    implanting a dopant into the substrate in the first region thereby forming a source region and a drain region in the first region of the substrate and also implanting the dopant into the poly silicon resistor;
    forming an inter-level dielectric (ILD) layer on the substrate over the dummy gate stack and over the poly silicon resistor;
    planarizing the ILD layer, thereby exposing the dummy gate stack and leaving a portion of the ILD layer over the poly silicon resistor; and
    replacing the dummy gate stack with a high k metal gate while using the portion of the ILD layer over the poly silicon resistor as a mask to protect the poly silicon resistor during replacing the dummy gate stack with the high k metal gate.

2. The method of claim 1, further comprising forming a spacer layer over the dummy gate stack and over the substrate in the second region before forming the poly silicon resistor so that the poly silicon resistor is formed on the spacer layer.

3. The method of claim 2, further comprising etching away portions of the spacer layer to leave spacers substantially adjacent sides of the gate stack and also between the poly silicon resistor and the substrate.

4. The method of claim 1, further comprising forming contacts on the poly silicon resistor.

5. The method of claim 1, wherein the implanting the dopant into the substrate in the first region thereby forming the source region and/or the drain region in the first region and also implanting the dopant into the poly silicon resistor is a single implantation process.

6. The method of claim 1, wherein poly silicon resistor thickness and the dummy gate stack thickness have a thickness difference in a range of approximately 40-100 angstrom.

7. The method of claim 1, wherein the planarizing the ILD layer is a chemical mechanical planarization (CMP) process.

8. A method of forming a semiconductor device, the method comprising:
    providing a substrate;
    forming a poly silicon gate on the substrate;
    forming a spacer layer along sides of the poly silicon gate and on the substrate;
    forming a poly silicon resistor on the spacer layer over the substrate;
    etching away a portion of the spacer layer on the substrate, thereby exposing a portion of the substrate;
    implanting a dopant into the substrate, to form a source/drain region proximate the poly silicon gate, and in the same process, implanting the dopant into the poly silicon resistor;
    covering the poly silicon resistor with an inter-level dielectric (ILD) layer; and
    replacing the poly silicon gate with a high k metal gate, using the ILD layer over the poly silicon resistor as a mask to protect the poly silicon resistor during the step of replacing the poly silicon gate stack with the high k metal gate.

9. The method of claim 8, further comprising forming an isolation feature in the substrate between the poly silicon gate and the poly silicon resistor.

10. The method of claim 8, further comprising implanting the dopant at a substantially uniform concentration in both the source/drain region and in the poly silicon resistor.

11. The method of claim 8, further comprising forming contacts on the poly silicon resistor.

12. The method of claim 8, further comprising forming a lightly doped drain (LDD) region in the substrate.

13. The method of claim 8, further comprising forming the poly silicon gate and forming the poly silicon resistor to have a thickness difference in a range of approximately 40-100 angstrom.

14. The method of claim 8, further comprising planarizing poly silicon gate and the poly silicon resistor.

* * * * *